(12) United States Patent
Kim et al.

(10) Patent No.: US 10,679,721 B2
(45) Date of Patent: Jun. 9, 2020

(54) STRUCTURE AND METHOD FOR TESTING THREE-DIMENSIONAL MEMORY DEVICE

(71) Applicant: Yangtze Memory Technologies Co., Ltd., Wuhan, Hubei (CN)

(72) Inventors: Jong Jun Kim, Hubei (CN); Feng Pan, Hubei (CN); Jong Seuk Lee, Hubei (CN); Zhenyu Lu, Hubei (CN); Yongna Li, Hubei (CN); Lidong Song, Hubei (CN); Youn Cheul Kim, Hubei (CN); Steve Weiyi Yang, Hubei (CN); Simon Shi-Ning Yang, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/046,869

(22) Filed: Jul. 26, 2018

(65) Prior Publication Data

US 2019/0057756 A1 Feb. 21, 2019

Related U.S. Application Data

(63) Continuation of application No. PCT/CN2018/077754, filed on Mar. 1, 2018.

(30) Foreign Application Priority Data

Mar. 8, 2017 (CN) .......................... 2017 1 0134368

(51) Int. Cl.
*G11C 29/00* (2006.01)
*G11C 29/50* (2006.01)
(Continued)

(52) U.S. Cl.
CPC ............ *G11C 29/50* (2013.01); *G11C 29/025* (2013.01); *G11C 29/48* (2013.01);
(Continued)

(58) Field of Classification Search
CPC .......... G11C 29/025; G11C 2029/0401; G11C 2029/5002; H01L 21/76895;
(Continued)

(56) References Cited

U.S. PATENT DOCUMENTS 9,236,131 B1 * 1/2016 Yuan ...................... G11C 16/10
9,876,031 B1 * 1/2018 Shimizu ............ H01L 27/11582
(Continued)

FOREIGN PATENT DOCUMENTS

CN  101207096 A  6/2008
CN  103377961 A  10/2013
(Continued)

OTHER PUBLICATIONS

International Search Report and Written Opinion of the International Searching Authority directed to related International Patent Application No. PCT/CN2018/077754, dated May 10, 2018, with attached English-language translation; 10 pages.
(Continued)

*Primary Examiner* — Uyen Smet
(74) *Attorney, Agent, or Firm* — Sterne, Kessler, Goldstein & Fox P.L.L.C.

(57) ABSTRACT

Embodiments of structures and methods for testing three-dimensional (3D) memory devices are disclosed. In one example, a 3D memory device includes a memory array structure, a peripheral device structure, and an interconnect layer in contact with a front side of the memory array structure and a front side of the peripheral device structure, and a conductive pad at a back side of the memory array structure and that overlaps the memory array structure. The memory array structure includes a memory array stack, a through array contact (TAC) extending vertically through at least part of the memory array stack, and a memory array contact. The peripheral device structure includes a test
(Continued)

circuit. The interconnect layer includes an interconnect structure. The conductive pad, the TAC, the interconnect structure, and at least one of the test circuit and the memory array contact are electrically connected.

15 Claims, 10 Drawing Sheets

(51) Int. Cl.
| | | |
|---|---|---|
| *G11C 29/48* | (2006.01) | |
| *H01L 27/11526* | (2017.01) | |
| *H01L 27/11573* | (2017.01) | |
| *G11C 29/02* | (2006.01) | |
| *H01L 21/768* | (2006.01) | |
| *H01L 23/48* | (2006.01) | |
| *H01L 23/528* | (2006.01) | |
| *H01L 27/11548* | (2017.01) | |
| *H01L 27/11556* | (2017.01) | |
| *H01L 27/11575* | (2017.01) | |
| *H01L 27/11582* | (2017.01) | |
| *H01L 27/11578* | (2017.01) | |
| *G11C 29/12* | (2006.01) | |
| *G11C 29/56* | (2006.01) | |
| *H01L 27/11551* | (2017.01) | |
| *G11C 29/04* | (2006.01) | |

(52) U.S. Cl.
CPC .. *H01L 21/76895* (2013.01); *H01L 21/76898* (2013.01); *H01L 23/481* (2013.01); *H01L 23/528* (2013.01); *H01L 27/11526* (2013.01); *H01L 27/11548* (2013.01); *H01L 27/11556* (2013.01); *H01L 27/11573* (2013.01); *H01L 27/11575* (2013.01); *H01L 27/11582* (2013.01); *G11C 2029/0401* (2013.01); *G11C 2029/1202* (2013.01); *G11C 2029/1204* (2013.01); *G11C 2029/1206* (2013.01); *G11C 2029/5002* (2013.01); *G11C 2029/5602* (2013.01); *H01L 27/11551* (2013.01); *H01L 27/11578* (2013.01)

(58) Field of Classification Search
CPC ............ H01L 21/76898; H01L 23/481; H01L 23/528; H01L 27/11548; H01L 27/11556; H01L 27/11575; H01L 27/11582
See application file for complete search history.

(56) References Cited

U.S. PATENT DOCUMENTS

| | | | |
|---|---|---|---|
| 9,966,318 B1* | 5/2018 | Pagani | .................... H01L 22/34 |
| 2008/0142928 A1 | 6/2008 | Sitaram et al. | |
| 2012/0262196 A1 | 10/2012 | Yokou | |
| 2013/0005688 A1 | 3/2013 | Zhang | |
| 2013/0153899 A1* | 6/2013 | Wada | ................. H01L 23/49816 |
| | | | 257/48 |
| 2014/0159251 A1 | 6/2014 | Marimuthu et al. | |
| 2014/0264903 A1 | 9/2014 | Chen et al. | |
| 2015/0311142 A1 | 10/2015 | Sekar et al. | |
| 2016/0181201 A1 | 6/2016 | Yang et al. | |
| 2016/0268166 A1* | 9/2016 | Nakajima | ................ H01L 21/78 |
| 2019/0057756 A1 | 2/2019 | Kim et al. | |

FOREIGN PATENT DOCUMENTS

| | | |
|---|---|---|
| CN | 103765516 A | 4/2014 |
| CN | 103943553 A | 7/2014 |
| CN | 105720026 A | 6/2016 |
| CN | 105895601 A | 8/2016 |
| CN | 106057786 A | 10/2016 |
| CN | 106449465 A | 2/2017 |
| CN | 106920797 A | 7/2017 |
| KR | 20080029615 A | 4/2008 |

OTHER PUBLICATIONS

Office Action filed in CN201880005231, filed Apr. 17, 2020, with attached English-language translation; 5 pages.

* cited by examiner

STRUCTURE AND METHOD FOR TESTING THREE-DIMENSIONAL MEMORY DEVICE

CROSS-REFERENCE TO RELATED APPLICATIONS

This application claims priority to PCT/CN2018/077754 filed on Mar. 1, 2018, which claims priority to Chinese Patent Application No. 201710134368.0 filed on Mar. 8, 2017, the entire contents of which are incorporated herein by reference.

BACKGROUND

Embodiments of the present disclosure relate to three-dimensional (3D) memory devices and testing methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of structures and methods for testing 3D memory devices are disclosed herein.

According to some embodiments of the present disclosure, a memory device includes a memory array structure, a first dielectric layer at a front side of the memory array structure, a plurality of first contacts in the first dielectric layer, a plurality of conductive pads at a backside of the memory array structure, a complementary metal-oxide-semiconductor (CMOS) structure, a metal layer including a plurality of metal patterns at a front side of the CMOS structure, a second dielectric layer on the metal layer, and a plurality of second contacts in the second dielectric layer. The memory array structure includes a memory array stack, a through array contact (TAC) extending vertically through at least part of the memory array stack, and one or more memory array contacts. The first dielectric layer and the second dielectric layer are joined face to face, such that the memory array structure is above the CMOS structure, and one or more electrical connections are formed by at least the plurality of conductive pads, the TAC, the plurality of first contacts, the plurality of second contacts, the plurality of metal patterns in the metal layer, and at least one of the one or more memory array contacts.

In some embodiments, at least one of the plurality of first contacts and at least one of the plurality of second contacts form a contact signal path. The one or more memory array contacts can include at least one of a word line contact and a bit line contact. The plurality of conductive pads, the TAC, the plurality of first contacts, the plurality of second contacts, the plurality of metal patterns in the metal layer, and the word line can be electrically connected to form a first one of the one or more electrical connections to test a plurality of contact signal paths. The plurality of conductive pads, the TAC, the plurality of first contacts, the plurality of second contacts, the plurality of metal patterns in the metal layer, and the bit line contact can be electrically connected to form a second one of the one or more electrical connections to test a plurality of contact signal paths. In some embodiments, the plurality of contact signal paths are connected in series. In some embodiments, at least some of the plurality of contact signal paths are connected in parallel. For example, one half of the plurality of contact signal paths can be connected in parallel.

In some embodiments, the CMOS structure includes a test circuit electrically connected to the metal layer. The test circuit can include at least one of a memory array structure test circuit and a contact signal path test circuit. The memory array structure test circuit can include at least one of a memory plane test circuit, a memory block test circuit, a bit line test circuit, and a word line test circuit.

In some embodiments, the memory array structure further includes a third contact (e.g., a through silicon via (TSV)). At least one of the plurality of conductive pads can be electrically connected to the TAC by the third contact.

According to some embodiments of the present disclosure, a method for forming a memory device is disclosed. A memory array structure including a memory array stack and one or more memory array contacts is formed. A TAC extending vertically through at least part of the memory array stack of the memory array structure is formed. A first dielectric layer is formed at a front side of the memory array structure. A plurality of first contacts are formed in the first dielectric layer. A plurality of conductive pads are formed at a backside of the memory array structure. A CMOS structure is formed. A metal layer including a plurality of metal patterns is formed at a front side of the CMOS structure. A second dielectric layer is formed on the metal layer. A plurality of second contacts are formed in the second dielectric layer. The first dielectric layer and the second dielectric layer are joined face to face, such that the memory array structure is above the CMOS structure, and one or more electrical connections are formed by at least the plurality of conductive pads, the TAC, the plurality of first contacts, the plurality of second contacts, the plurality of metal patterns in the metal layer, and at least one of the one or more memory array contacts.

In some embodiments, prior to forming a metal layer at a front side of the CMOS structure, a test circuit is formed. The metal layer can be electrically connected to the test circuit.

In some embodiments, prior to forming a plurality of conductive pads at a backside of the memory array structure, a third contact (e.g., a TSV) is formed from the backside of the memory array structure. At least one of the plurality of conductive pads can be electrically connected to the TAC by the third contact. The at least one of the plurality of conductive pads can be formed above the third contact.

According to some embodiments of the present disclosure, a method for testing a memory device is disclosed. The memory device includes a memory array structure, a first dielectric layer at a front side of the memory array structure, a plurality of first contacts in the first dielectric layer, a plurality of conductive pads at a backside of the memory array structure, a CMOS structure, a metal layer including a plurality of metal patterns at a front side of the CMOS structure, a second dielectric layer on the metal layer, and a plurality of second contacts in the second dielectric layer. The memory array structure includes a memory array stack, a TAC extending vertically through at least part of the memory array stack, and one or more memory array contacts. An input signal for testing a test structure in the memory device is received. The input signal is transmitted to the test structure through a first probe and a first electrical connection including one of the plurality of conductive pads, one of the plurality of TACs, one of the plurality of first contacts, one of the plurality of second contacts, one of the plurality of metal patterns in the metal layer, and at least one of the one or more memory array contacts. An output signal is received from the test structure through a second probe and a second electrical connection including one of the plurality of conductive pads, one of the plurality of TACs, one of the plurality of first contacts, one of the plurality of second contacts, one of the plurality of metal patterns in the metal layer, and at least one of the one or more memory array contacts. A characteristic of the test structure in the memory device is determined based on the input signal, the output signal, and the test structure.

In some embodiments, the test structure includes at least one of a contact signal path comprising at least one of the plurality of first contacts and at least one of the plurality of second contacts, and a structure of the memory array structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
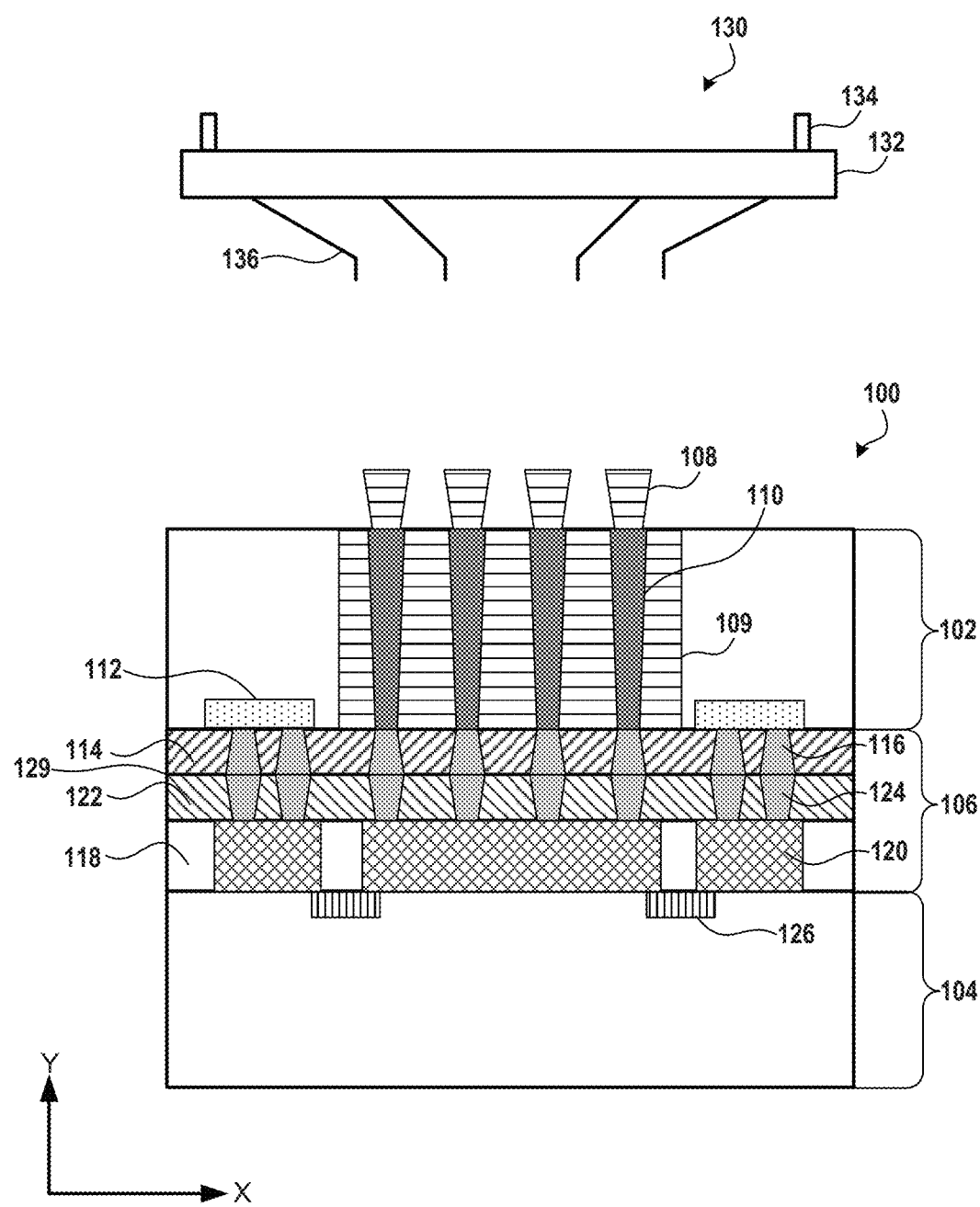
FIG. 1 illustrates a cross-section of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In some 3D memory devices, peripheral devices and memory array devices can be stacked on top of one another. So far, however, there is no effective method for testing the performance of the internal structures of those 3D memory devices using probe cards before packaging the 3D memory devices.

Various embodiments in accordance with the present disclosure provide a 3D memory device with a structure for testing the 3D memory device. The 3D memory device disclosed herein can include an interconnect layer with interconnect structures between the front sides of the stacked peripheral device structure (e.g., a CMOS chip) and memory array structure (e.g., a memory array chip) and contacting the TACs of the memory array structure. The 3D memory device disclosed herein can further include conductive pads at the backside of the memory array structure for probe cards, so that various characteristics of different structures of the 3D memory device, as well as the quality of the hybrid bonding process forming the 3D memory device, can be tested using probe cards with real device density. As a result, the 3D memory device disclosed herein can enable the testability and uniformity of the characterization of the 3D memory device formed by hybrid bonding of the peripheral device structure and memory array structure, thereby reducing the overall process development time and increasing the manufacturing yield.

FIG. 1 illustrates a cross-section of an exemplary 3D memory device 100 according to some embodiments of the present disclosure. As shown in FIG. 1, 3D memory device 100 can include a memory array structure 102 and a peripheral device structure 104 (e.g., a CMOS structure), which are positioned face to face with their front sides facing towards one another. As used herein, the term "front side" of a structure (e.g., memory array structure 102 or peripheral device structure 104) refers to the side of the structure at which a device is formed (e.g., a memory cell in memory array structure 102 or a peripheral transistor in peripheral device structure 104). Conversely, as used herein, the term "backside" refers to the side of the structure (e.g., memory array structure 102 or peripheral device structure 104) that is opposite to the front side.

As shown in FIG. 1, 3D memory device 100 can include an interconnect layer 106 between memory array structure 102 and peripheral device structure 104 in the vertical direction (e.g., the y-direction as shown in FIG. 1 or the thickness direction). Interconnect layer 106 can be in contact with the front side of memory array structure 102 and the front side of peripheral device structure 104. 3D memory device 100 can further include a plurality of conductive pads 108 (e.g., bonding pads or landing pads) at the backside of memory array structure 102 and that are electrically connected to memory array structure 102, interconnect layer 106, and peripheral device structure 104. In some embodiments, conductive pads 108 are disposed on the top surface of 3D memory device 100, i.e., above memory array structure 102 and peripheral device structure 104.

In some embodiments, memory array structure 102 includes a memory array stack 109 in a memory array region. Memory array stack 109 can be formed on a front side of a substrate (not shown) and can include an alternating conductor/dielectric stack and an array of NAND strings extending through the alternating conductor/dielectric stack. The alternating conductor/dielectric stack can include alternating conductor layers (e.g., metal layers or polysilicon layers) and dielectric layers (e.g., silicon oxide layers or silicon nitride layers). Each NAND string can include a plurality of vertically-stacked memory cells each controlled by a respective conductor layer (functioning as a control gate) of the alternating conductor/dielectric stack that surrounds the NAND string. The conductor layers in the alternating conductor/dielectric stack can extend in the lateral direction (e.g., the x-direction as shown in FIG. 1 or the width direction) outside the memory array region to thereby form word lines of memory array structure 102. Each NAND string can also include a drain at an end (e.g., at the front side of memory array structure 102). The drain of each NAND string can be electrically connected to a respective one of a plurality of bit lines of memory array structure 102. In some embodiments, each NAND string further includes multiple select gates (e.g., a source select gate and a drain select gate). Some structures described in this paragraph are not shown in FIG. 1 as they would be appreciated by a person skilled in the pertinent art.

Memory array structure 102 can include one or more TACs 110 each extending vertically through at least part of memory array structure 102 (e.g., memory array stack 109). In some embodiments, TAC 110 can extend vertically through the entire thickness of memory array structure 102, i.e., between the two nominally parallel surfaces at the front side and backside of memory array structure 102. For example, TAC 110 can pass through the entire thickness of the alternating conductor/dielectric stack and the entire thickness of the substrate of memory array structure 102. In some embodiments, TAC 110 can extend vertically through part of the entire thickness of memory array structure 102. In one example, TAC 110 can pass through the entire thickness of the alternating conductor/dielectric stack and part of the entire thickness of the substrate of memory array structure 102. In another example, TAC 110 can pass through part of the entire thickness of the alternating conductor/dielectric stack without reaching to the substrate. Each TAC 110 can include a vertical opening filled with conductor materials, including, but not limited to, tungsten (W), cobalt (Co), copper (Cu), aluminum (Al), doped silicon, silicides, or any combination thereof.

Memory array structure 102 can further include one or more memory array contacts 112. Memory array contacts 112 can be in the memory array region and/or outside the memory array region, for example, in a staircase region of memory array structure 102. Memory array contacts 112 can include word line contacts, bit line contacts, and gate select contacts. The word line contacts can be in the staircase region and electrically connect to the word lines, such that each word line contact can individually address the corresponding word line. The bit line contacts can electrically connect to the NAND strings by the bit lines, such that each bit line contact can individually address the corresponding NAND string. The gate select contacts can electrically connect to the select gates. Memory array contacts 112 can include conductor materials, including, but not limited to, W, Co, Cu, Al, silicides, or any combination thereof. Some structures described in this paragraph are not shown in FIG. 1 as they would be appreciated by a person skilled in the pertinent art.

As shown in FIG. 1, interconnect layer 106 can include a first dielectric layer 114 at the front side of memory array structure 102, a metal layer 118 at the front side of peripheral device structure 104, and a second dielectric layer 122 on metal layer 118. Interconnect layer 106 can include a plurality first contacts 116 in first dielectric layer 114, a plurality of second contacts 124 in second dielectric layer 122, and a plurality of metal patterns 120 in metal layer 118, as described further below. In some embodiments, interconnect layer 106 further includes a bonding interface 129 between first dielectric layer 114 and second dielectric layer 122. For example, first dielectric layer 114 and second dielectric layer 122 can be joined face to face by hybrid bonding. Hybrid bonding (also known as "metal/dielectric hybrid bonding") can be a direct bonding technology (e.g., forming bonding between surfaces without using intermediate layers, such as solder or adhesives), which obtains metal-metal bonding and dielectric-dielectric bonding simultaneously. By hybrid bonding, chemical bonds can form between the dielectric materials of first dielectric layer 114 and the dielectric materials of second dielectric layer 122, and physical interdiffusion can occur between the conductor materials (e.g., Cu) of first contacts 116 and the conductor materials (e.g., Cu) of second contacts 124.

The dielectric materials of first dielectric layer 114 and second dielectric layer 122 can include, but not limited to, silicon oxide, silicon nitride, silicon oxynitride, low-k dielectrics, or any combination thereof. First contacts 116 and second contacts 124 can each include a vertical opening (e.g., a via hole or a trench) filled with conductor materials including, but not limited to, W, Co, Cu, Al, silicides, or any combination thereof. As used herein, the term "contact" can broadly include any suitable types of interconnects, such as middle-end-of-line (MEOL) interconnects and back-end-of-line (BEOL) interconnects, including vertical interconnect accesses (e.g., vias) and lateral lines (e.g., interconnect lines).

In some embodiments, metal patterns 120 in metal layer 118 are patterned based on the layout of TACs 110 and/or first contacts 116 and second contacts 124, so that suitable interconnect structures can be formed in interconnect layer 106 to provide electrical connections for testing the structures in 3D memory device 100. Metal patterns 120 can include, but not limited to, W, Co, Cu, Al, metal silicides, or any combination thereof. Dielectric materials can be formed in metal layer 118 to electrically isolate metal patterns 120, such as silicon oxide, silicon nitride, silicon oxynitride, low-k dielectrics, or any combination thereof. It is understood that the number of metal layers in interconnect layer 106 is not limited by the example shown in FIG. 1, and can be any suitable number in order to form suitable electrical connections between memory array structure 102 and peripheral device structure 104.

In some embodiments, the interconnect structures in interconnect layer 106 include first contacts 116 and second contacts 124 on the two sides of bonding interface 129. In other words, an interconnect structure can pass through bonding interface 129 and include one or more of first contacts 116, second contacts 124, and metal patterns 120 in metal layer 118, which are electrically connected.

In some embodiments, conductive pads 108 are in or on one or more BEOL interconnect layers (not shown) at the backside of memory array structure 102. Conductive pads 108 can be electrically connected to TACs 110 by the interconnects in the BEOL interconnect layers. In some embodiments, to reduce stress caused by conductive pads 108, the distance in the vertical direction between conductive pads 108 and memory array stack 109 is at least about 3 μm, such as at least 3 μm. For example, the combined thickness of the substrate of memory array structure 102 and the BEOL interconnect layers underneath conductive pads 108 can be at least 3 μm. In some embodiments, the vertical distance between conductive pads 108 and memory array stack 109 is between 3 μm and 10 μm (e.g., 3 μm, 4 μm, 5 μm, 6 μm, 7 μm, 8 μm, 9 μm, 10 μm, in any range bounded on the lower end defined by any of these values, or in any range defined by any two of these values). Conductive pads 108 can include conductor materials, including, but not limited to, W, Co, Cu, Al, silicides, or any combination thereof.

A plurality of electrical connections can be formed in 3D memory device 100 for testing structures in 3D memory device 100 (referred to herein as "test structures"). In some embodiments, at least one of conductive pads 108, at least one of TACs 110, at least one of first contacts 116, at least one of second contacts 124, at least one of metal patterns 120 in metal layer 118, and at least one of memory array contacts 112 (e.g., a bit line contact and/or a word line contact) are electrically connected to form an electrical connection (also referred to herein as a "signal path") for testing the test structures.

It is understood that it may not be necessary to test all the repetitive structures in memory array structure 102 (e.g., an array of NAND strings each having multiple memory cells, multiple memory fingers, blocks, and planes, or multiple bit lines and word line). In some embodiments, one or more sample structures of the repetitive structures can be tested to reflect the characteristics of the repetitive structures in general. As a result, in some embodiments, only some of conductive pads 108, TACs 110, memory array contacts 112, and the interconnect structures in interconnect layer 106 are used to form the electrical connections for testing the sample test structures.

In some embodiments, peripheral device structure 104 includes a peripheral device on a substrate (not shown). The peripheral device can include any suitable digital, analog, and/or mixed-signal peripheral circuits used for facilitating the operation of 3D memory device 100. For example, the peripheral device can include one or more of a page buffer, a decoder (e.g., a row decoder and a column decoder), a driver, a charge pump, a current or voltage reference, or any active or passive components of the circuits (e.g., transistors, diodes, resistors, or capacitors). In some embodiments, the peripheral device is formed using CMOS technology, and peripheral device structure 104 can be referred to as a "CMOS structure" or a "CMOS chip."

As shown in FIG. 1, peripheral device structure 104 can include one or more test circuits 126 at the front side of peripheral device structure 104 and that are electrically connected to metal patterns 120 of metal layer 118. In some embodiments, test circuits 126 are electrically connected to conductive pads 108, TACs 110, memory array contacts 112, and the interconnect structures in interconnect layer 106. That is, test circuits 126 can be part of the electrical connections for testing the test structures of 3D memory device 100. Test circuits 126 can include one or more peripheral devices and/or dedicated test devices for testing purposes. In some embodiments, test circuits 126 include memory array structure test circuit for testing test structures in memory array structure 102, and a contact signal path test circuit for testing interconnect structures in interconnect layer 106. The memory array structure test circuit can include a memory plane test circuit, a memory block test circuit, a bit line test circuit, and a word line test circuit. In some embodiments, test circuits 126 include peripheral device structure test circuit for testing structures in peripheral device structure 104, such as page buffers, decoders, etc.

FIG. 1 also illustrates an exemplary probe card 130 for testing 3D memory device 100. Probe card 130 can be an interface between an electronic test system (not shown; e.g., a controller) and a "device under test" (DUT) (e.g., 3D memory device 100). Probe card 130 can include a printed circuit board (PCB) 132 with an opening (not shown) in which 3D memory device 100 can be inserted and docked during the test. Probe card 130 can also include a plurality of terminal pins 134 configured to provide electrical connections between the electronic test system and PCB 132. Probe card 130 can further include a plurality of probes 136 that can be in contact with conductive pads 108 when 3D memory device 100 is docked in probe card 130 during the test. In some embodiments, the number of probes 136 are the same as the number of conductive pads 108. In some embodiments, the layout of conductive pads 108 matches the arrangement of probes 136 of probe card 130, so that each conductive pad 108 can be in contact with a respective probe 136 during the test. In some embodiments, probe card 130 also includes movement mechanisms (not shown) configured to move probe card 130 in the vertical direction and/or the lateral direction to align probes 136 with conductive pads 108.

In some embodiments, once 3D memory device 100 is docked into probe card 130, an input test signal (e.g., a voltage signal or a current signal) is provided by the electronic test system to probe card 130 for testing a test structure of 3D memory device 100. The input signal can be received by 3D memory device 100 at a first conductive pad 108 through a first probe 136. The input signal can then be transmitted to the test structure by a first electrical connection as described above in detail. An output signal (e.g., another voltage signal or another current signal) can be received at a second conductive pad 108 from the test structure by a second electrical connection as described above in detail. Probe card 130 then can transmit the output signal to the electronic test system by a second probe 136 in contact with second conductive pad 108. The electronic test system can determine one or more characteristics (e.g., resistance or capacitance) of the test structure and/or the quality of hybrid bonding based on the input signal, the output signal, and the test structure.

Figure 2:
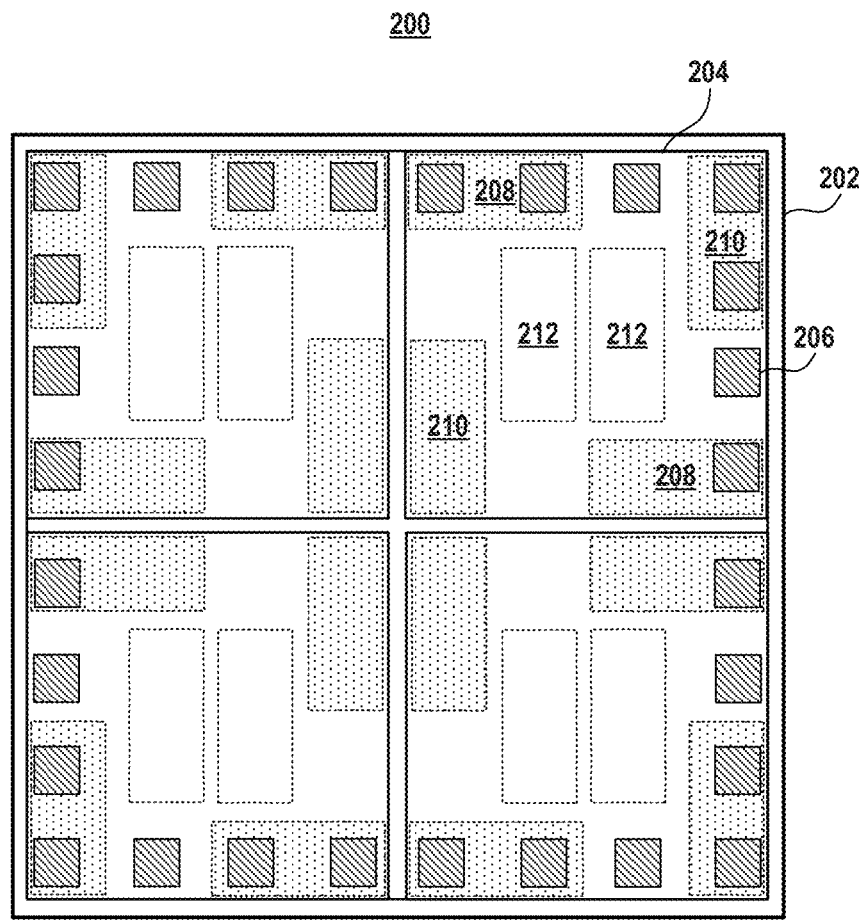
FIG. 2 is a top view of an exemplary 3D memory device, according to some embodiments of the present disclosure.

FIG. 2 is a top view of a 3D memory device 200, according to some embodiments of the present disclosure. In some embodiment, 3D memory device 200 is the same as 3D memory device 100 depicted in FIG. 1. 3D memory device 200 can include a peripheral device structure 202 (e.g., a CMOS chip) and a memory array structure 204 (e.g., including four memory planes as shown in FIG. 2) that are hybrid bonded face to face.

As shown in FIG. 2, 3D memory device 200 can include a plurality of conductive pads 206 on the top surface of 3D memory device 200, e.g., at the backside of memory array structure 204. Each conductive pad 206 can overlap memory array structure 204. In one example as shown in FIG. 2, each conductive pad 206 can completely overlap memory array structure 204, i.e., inside the boundary of memory array structure 204 in the top view. It is understood that in some embodiments, one or more conductive pads 206 partially overlap memory array structure 204, i.e., partially outside the boundary of memory array structure 204. Nevertheless, by overlapping conductive pads 206 and memory array structure 204, die size of 3D memory device 200 can be reduced. In some embodiments, each conductive pad 206 is nominally identical in the top view, e.g., has the nominally same size and the nominally same shape in the top view. In some embodiments, the pitch of adjacent conductive pads 206 is nominally the same as well. The layout of conductive pads 206 in the top view can be designed to match the configuration of the probes of the probe card used for testing 3D memory device 200.

In some embodiments, 3D memory device 200 further includes various memory array contacts, including word line contacts 208 and bit line contacts 210. In some embodiments, to ensure uniform bonding and reduce dishing at the bonding interface, dummy contacts 212 are added to memory array structure 204. Dummy contacts in both memory array structure 204 and peripheral device structure 202 can be physically bonded but cannot form electrical connections. It is understood that due to flip bonding of memory array structure 204, the memory array contacts and dummy contacts cannot be seen in the top view and thus, are represented by dashed lines in FIG. 2.

Figure 3:
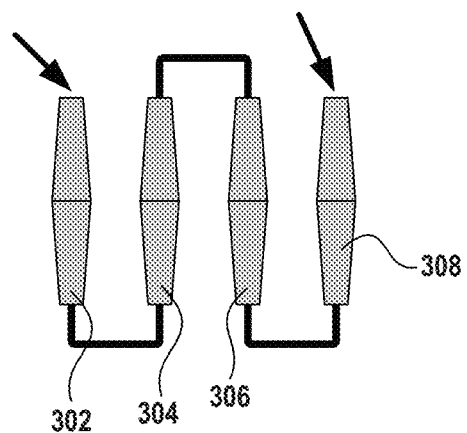
FIG. 3 depicts an exemplary test structure of a set of contact signal paths, according to some embodiments of the present disclosure.
Figure 4:
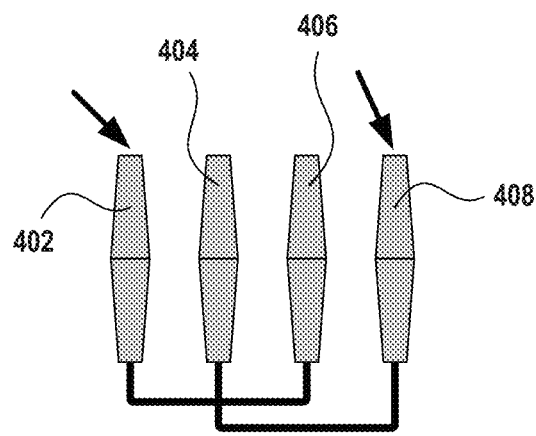
FIG. 4 depicts another test structure of a set of contact signal paths, according to some embodiments of the present disclosure.

FIGS. 3 and 4 depict exemplary test structures of a set of contact signal paths, according to some embodiments of the present disclosure. In addition to structures in the memory array structure and the peripheral device structure, test structures can also include interconnect structures in the interconnect layer between the memory array structure and the peripheral device structure. The characteristics (e.g., resistance and/or capacitance) of the interconnect structures can reflect the quality of the hybrid bonding performed to form the 3D memory devices (e.g., 3D memory devices 100 and 200). In some embodiments, the interconnect structures in the interconnect layer can include first contacts for the memory array structure (e.g., first contacts 116 in FIG. 1) and second contacts for the peripheral device structure (e.g., second contacts 124 in FIG. 1) that are in contact with one another through the bonding interface. The electrical connection formed by at least one of the first contacts and at least one of the second contacts is referred to herein as a "contact signal path." The characteristics (e.g., resistance and/or capacitance) of the contact signal paths can reflect the quality of the hybrid bonding, such as the accuracy of contact alignment and the existence of gap at the bonding surface.

The configuration of the interconnect structures can be different when testing different characteristics (e.g., resistance or the capacitance) of a contact signal path. Moreover, since the capacitance or the resistance of one contact signal path can be relatively small sometimes, measuring the capacitance or the resistance of only one contact signal path can lead to a large deviation, resulting in an inaccurate test result.

Thus, in some embodiments, the present disclosure provides a method for improving the accuracy of testing contact signal paths. The method includes providing an interconnect structure to test a plurality of contact signal paths, obtaining testing values of the plurality of contact signal paths, and averaging the testing values of the plurality of contact signal paths. The average value can be considered as the testing result of a contact signal path. For example, when a set of contact signal paths include n contact signal paths and the resistance of the entire set of contact signal paths is R, a resistance of a contact signal path is thus R/n, where n is a positive integer.

The configuration of the interconnect structures can be different when testing the resistance or the capacitance of a contact signal path. In some embodiment, to test the resistance of a contact signal path, the first contacts and the second contacts forming the contact signal paths are connected in series. In other words, the interconnect structure of the contact signal paths can have a serpentine configuration, for example, as shown in FIG. 3. FIG. 3 illustrates four contact signal paths 302, 304, 306, and 308, which are connected in series. The connections between contact signal paths can be made by metal patterns (labeled as thick solid lines in FIG. 3) in metal layers above and/or below the contacts, such as metal patterns 120 in metal layer 118 in FIG. 1. It is understood that although not shown in FIG. 3, as described above in FIG. 1, the set of contact signal paths 302, 304, 306, and 308 can be electrically connected to the conductive pads, the TACs, the metal patterns, and the memory array contacts in series to form complete electrical connections for testing. In some embodiments, when the resistance of the set of contact signal paths 302, 304, 306, and 308 is measured, two probes of a probe card can contact two conductive pads corresponding to contact signal path 302 and contact signal path 308, respectively (labeled as arrows in FIG. 3).

In some embodiments, a method for testing the capacitance of a contact signal path is provided. The interconnect structure of the contact signal paths can have a comb-like configuration (e.g., as shown in FIG. 4), such that each one half of the contact signal paths are connected in parallel. For example, the odd-numbered contact signal paths can be connected in parallel, and the even-numbered contact signal paths are connected in parallel. The contact signal paths are numbered sequentially from one end of the interconnect structure to the other end of the interconnect structure according to the position of each contact signal path in the interconnect structure. Specifically, assuming the interconnect structure includes n contact signal paths, the n contact signal paths are sequentially numbered as the first contact signal path, the second contact signal path, until the n-th contact signal path.

FIG. 4 illustrates four contact signal paths 402, 404, 406, and 408 in a comb-like configuration. First contact signal path 402 and third contact signal path 406 can be connected in parallel, and second contact signal path 404 and fourth contact signal path 408 can be connected in parallel. The connection between contact signal paths 402 and 406 and the connection between contact signal paths 404 and 408 can be made by metal patterns (labeled as thick solid lines in FIG. 4) in metal layers above and/or below the contacts, such as metal patterns 120 in metal layer 118 in FIG. 1. When the capacitance of the set of contact signal paths 402, 404, 406, and 408 is measured, two probes of a probe card can contact two conductive pads corresponding to contact signal path 402 and contact signal path 408, respectively (labeled as arrows in FIG. 4).

Figure 5:
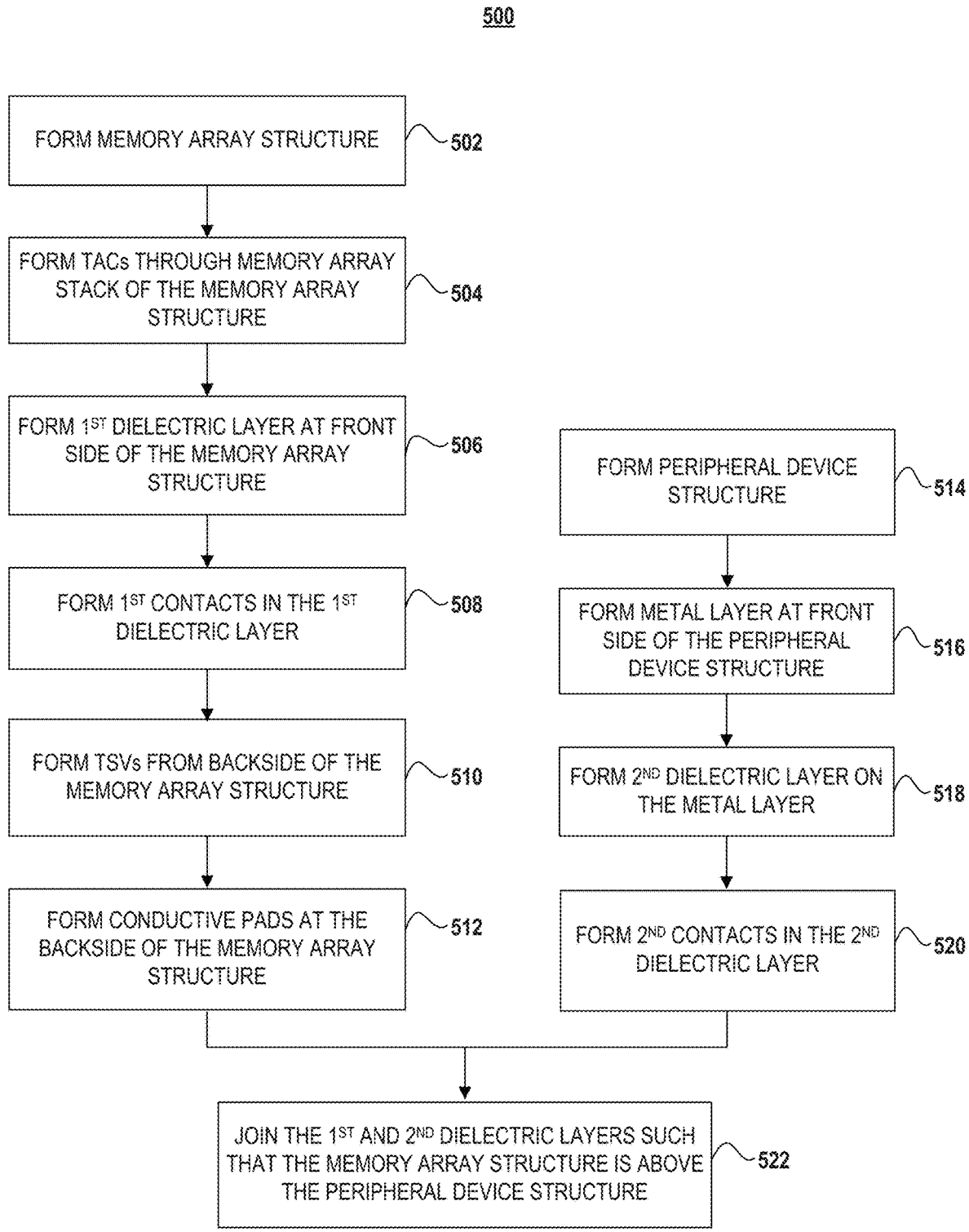
FIG. 5 is a flowchart of an exemplary method for forming a 3D memory device, according to some embodiments of the present disclosure.

FIG. 5 is a flowchart of an exemplary method 500 for forming a 3D memory device, according to some embodiments of the present disclosure. FIGS. 7A-7J illustrate an exemplary fabrication process for forming a 3D memory device, according to some embodiments of the present disclosure. An example of the 3D memory device depicted in FIGS. 5 and 7A-7J is 3D memory devices 100 and 200 depicted in FIGS. 1 and 2. It should be understood that the operations shown in method 500 are not exhaustive and that other operations can be performed as well before, after, or between any of the illustrated operations.

Figure 7A:
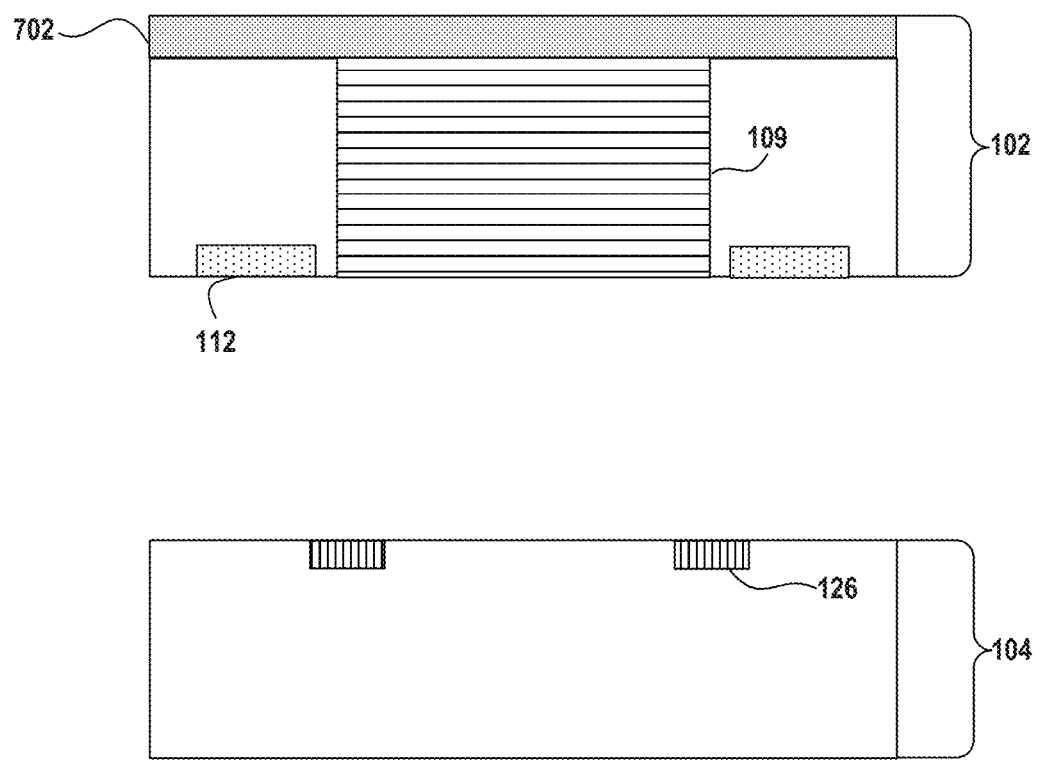
FIGS. 7A-7J illustrate an exemplary fabrication process for forming a 3D memory device, according to some embodiments of the present disclosure.

Referring to FIG. 5, method 500 starts at operation 502, in which a memory array structure is formed. As illustrated in FIG. 7A, memory array stack 109 can be formed on the front side of a substrate 702. Memory array contacts 112 (e.g., word line contacts, bit line contacts, and select gate contacts) can be formed at the front side of memory array structure 102. For ease of illustration, memory array structure 102 is shown upside down in FIGS. 7A-7J such that the backside of memory array structure 102 is above the front side. However, it is understood that in practice, memory array structure 102 can be flipped such that the backside of substrate 702 becomes the bottom surface of memory array structure 102 during the fabrication process. In some embodiments, memory array stack 109 is formed by multiple fabrication processes, including, but not limited to, thin film deposition of dielectric layers, etching of channel holes and slits, thin film deposition of memory films in the channel holes, and gate and word line replacement. As to memory array contacts 112, vertical openings can be patterned and etched through dielectric layers by dry/wet etch process, followed by deposition of conductor materials and chemical mechanical polishing (CMP) of excess conductor materials.

Figure 7B:
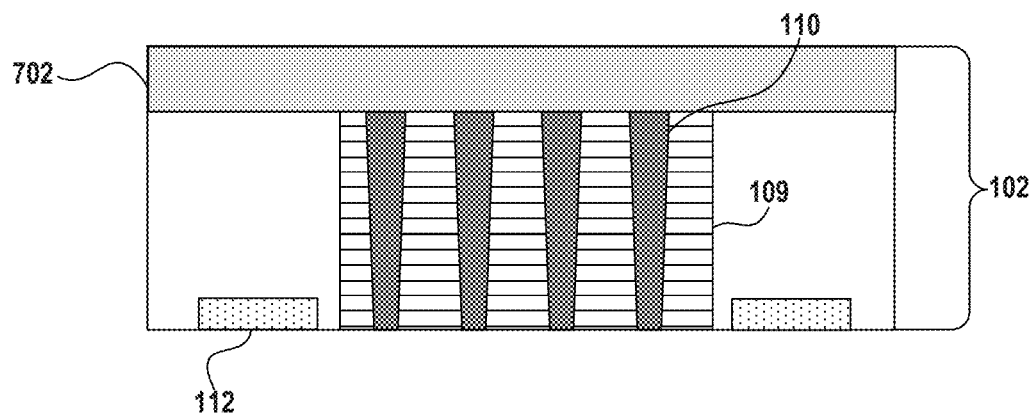

Method 500 proceeds to operation 504, as illustrated in FIG. 5, in which one or more TACs each extending vertically through the memory array stack are formed. As illustrated in FIG. 7B, TACs 110 are formed in memory array structure 102, each of which extends vertically through the entire thickness of memory array stack 109. In some embodiments, fabrication processes to form TACs 110 include forming vertical openings through memory array stack 109 by dry/wet etch process, followed by filling the openings with conductor materials and other materials (e.g., dielectric material) for isolation purposes. TACs 110 can include conductor materials including, but not limited to, W, Co, Cu, Al, silicides, or any combination thereof. The openings of TACs 110 can be filled using atomic layer deposition (ALD), chemical vapor deposition (CVD), physical vapor deposition (PVD), electroplating, any other suitable processes, or any combination thereof.

Figure 7C:
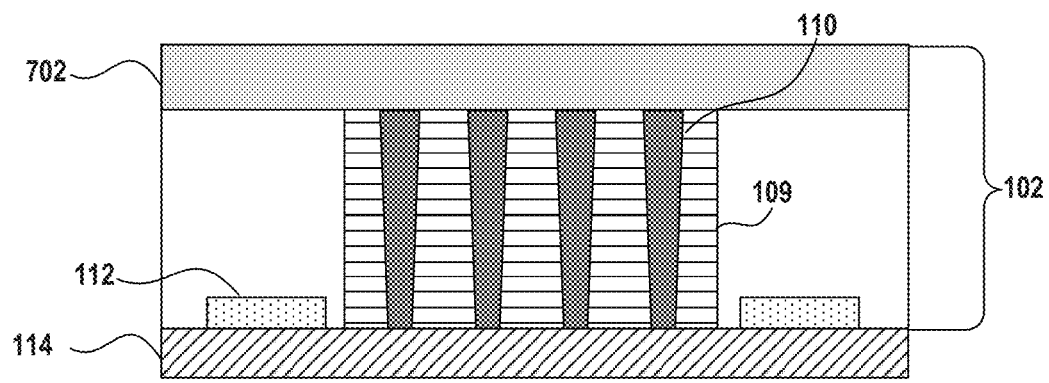

Method 500 proceeds to operation 506, as illustrated in FIG. 5, in which a first dielectric layer is formed at the front side of the memory array structure. As illustrated in FIG. 7C, first dielectric layer 114 is formed at the front side of memory array structure 102. First dielectric layer 114 can be formed by one or more thin film deposition processes, such as ALD, CVD, PVD, or any combination thereof. First dielectric layer 114 can include dielectric materials including, but not limited to, silicon oxide, silicon nitride, low-k dielectrics, or any combination thereof.

Figure 7D:
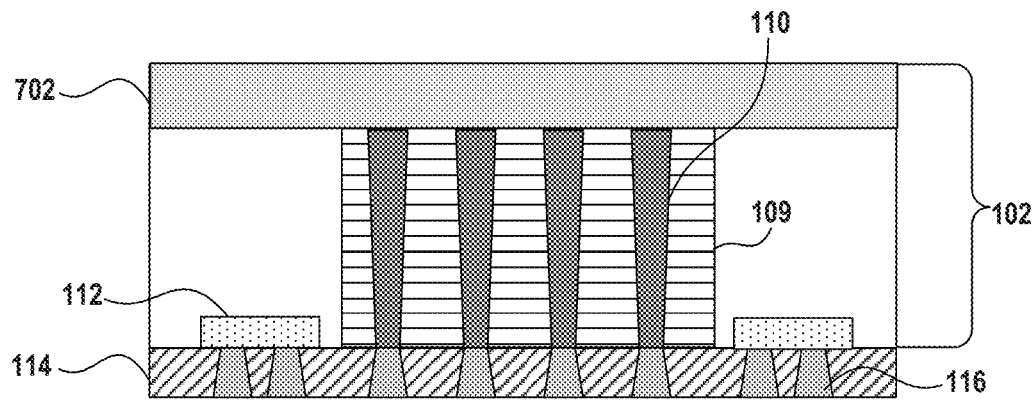

Method 500 proceeds to operation 508, as illustrated in FIG. 5, in which a plurality of first contacts are formed in the first dielectric layer. As illustrated in FIG. 7D, first contacts 116 are formed in first dielectric layer 114. At least some first contacts 116 can be in contact with TACs 110 to form electrical connections with TACs 110. At least some first contacts 116 can be in contact with memory array contacts 112 to form electrical connections with memory array contacts 112. In some embodiments, fabrication processes to form first contacts 116 include forming vertical openings through first dielectric layer 114 by dry/wet etch process, followed by filling the openings with conductor materials. First contacts 116 can include conductor materials including, but not limited to, W, Co, Cu, Al, silicides, or any combination thereof. The openings of first contacts 116 can be filled using ALD, CVD, PVD, electroplating, any other suitable processes, or any combination thereof.

Figure 7E:
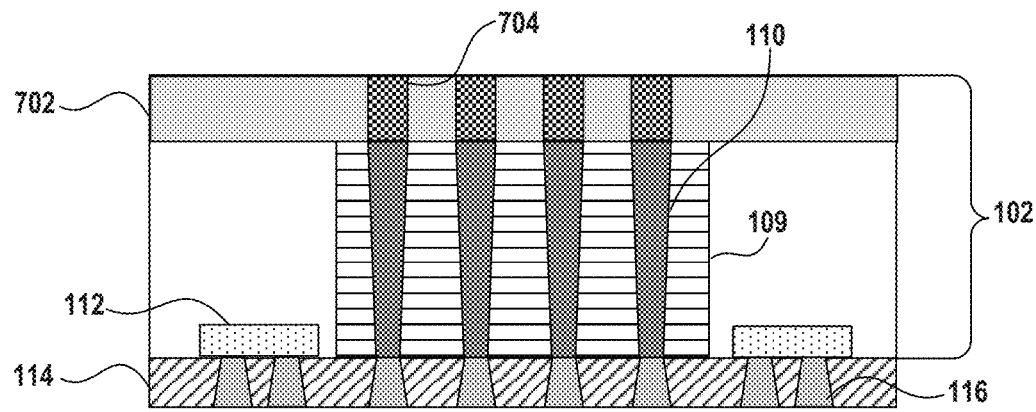

Method 500 proceeds to operation 510, as illustrated in FIG. 5, in which through silicon contacts (e.g., TSVs) are formed from the backside of the memory array structure. As illustrated in FIG. 7E, TSVs 704 can be formed through substrate 702 from the backside of memory array structure 102 (e.g., the backside of substrate 702). Each TSV 704 can be in contact with corresponding TAC 110 to form electrical connections between TSVs 704 and TACs 110. In some embodiments, substrate 702 is thinned first from its backside before forming TSVs 704 using, for example, grinding, wet etch, dry etch, CMP, or any combination thereof. TSVs 704 can be formed through either a substrate with full thickness or a thinned substrate. In some embodiments, fabrication processes to form TSVs include forming vertical openings through substrate 702 (regardless of whether substrate 702 has been thinned or not) by dry/wet etch process, followed by filling the openings with conductor materials. TSVs 704 can include conductor materials and other materials (e.g., dielectric material) for isolation purposes. The conductor materials can include, but not limited to, W, Co, Cu, Al, silicides, or any combination thereof. The openings of TSVs 704 can be filled using ALD, CVD, PVD, electroplating, any other suitable processes, or any combination thereof.

In some embodiments, TACs 110 extend vertically through part of the entire thickness of memory array stack 109. That is, TACs 110 cannot reach substrate 702, and TSVs 704 can extend vertically further into memory array stack 109 to contact TACs 110 in memory array stack 109. In some embodiments, TACs 110 extend vertically through not only the entire thickness of memory array stack 109, but also further into substrate 702. Thus, TSVs 704 can contact TACs 110 in substrate 702. In some embodiments, TACs 110 extend vertically through the entire thickness of memory array stack 109, as well as the entire thickness of substrate 702. Thus, TSVs 704 can be omitted.

Figure 7F:
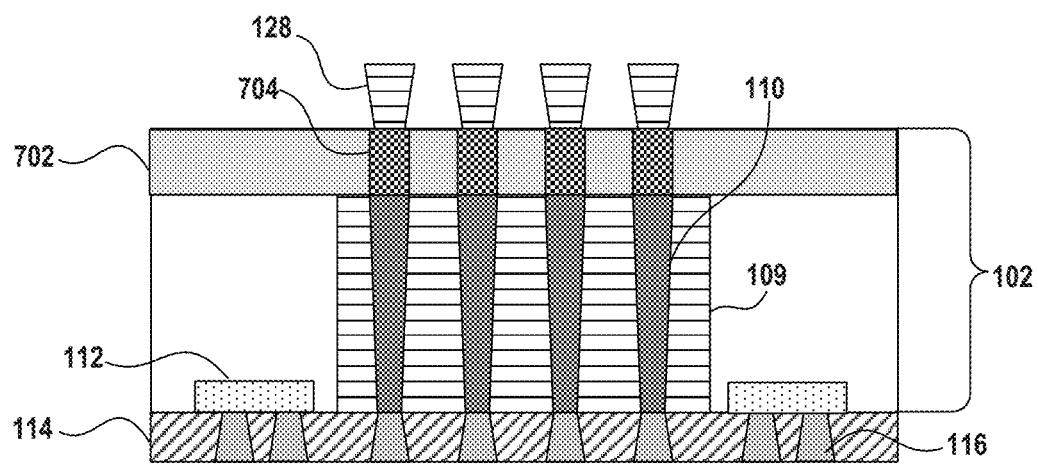

Method 500 proceeds to operation 512, as illustrated in FIG. 5, in which a plurality of conductive pads are formed at the backside of the memory array structure. As illustrated in FIG. 7F, conductive pads 128 can be formed at the backside of memory array structure 102 and above TSVs 704. Conductive pads 128 can be electrically connected to TSVs 704, TACs 110, first contacts 116, and memory array contacts 112. In some embodiments, one or more BEOL interconnect layers are formed on the backside of substrate 702, and conductive pads 128 are formed on the BEOL interconnect layers. In some embodiments, conductive pads 128 are part of a BOEL interconnect layer. In some embodiments, fabrication processes to form conductive pads 128 include forming one or more dielectric layers and vertical openings through the dielectric layer(s) by dry/wet etch process, followed by filling the openings with conductor materials. Conductive pads 128 can include conductor materials including, but not limited to, W, Co, Cu, Al, silicides, or any combination thereof. The openings of conductive pads 128 can be filled using ALD, CVD, PVD, electroplating, any other suitable processes, or any combination thereof.

Method 500 proceeds to operation 514, as illustrated in FIG. 5, in which a peripheral device structure (e.g., a CMOS structure) is formed. It is understood that the order of performing operations 502-512 and performing operations 514-520 is not limited. In some embodiments, operations 502-512 and operations 514-520 are performed in parallel. As illustrated in FIG. 7A, test circuits 126 are formed at the front side of peripheral device structure 104. Test circuits 126 can include transistors and local interconnects of the transistors formed by standard CMOS fabrication processes. One or more peripheral devices (not shown) can be formed in peripheral device structure 104 by standard CMOS fabrication processes as well.

Figure 7G:
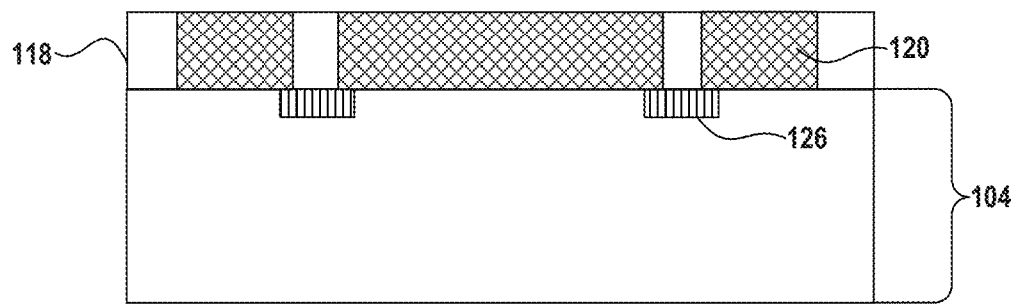
Figure 7H:
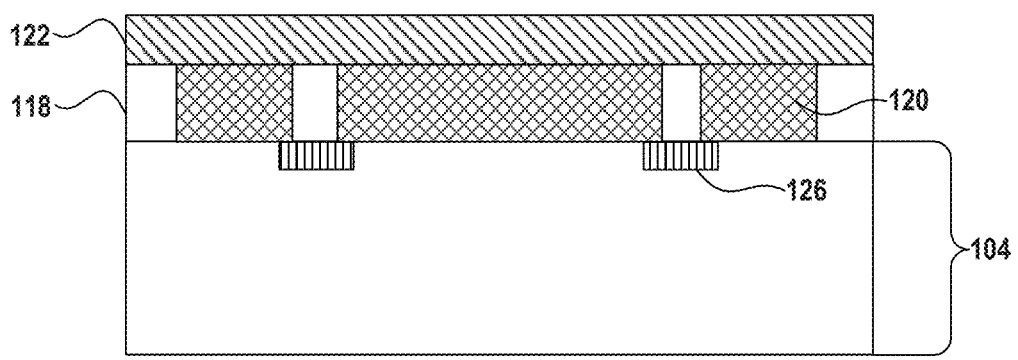

Method 500 proceeds to operation 516, as illustrated in FIG. 5, in which a metal layer is formed at the front side of the peripheral device structure. As illustrated in FIG. 7G, metal layer 118 including metal patterns 120 is formed at the front side of peripheral device structure 104. In some embodiments, metal patterns 120 can be in contact with test circuits 126 and/or the peripheral device in peripheral device structure 104. In some embodiments, fabrication processes to form metal layer 118 include forming a dielectric layer and patterning the openings (e.g., via holes and trenches) for metal patterns 120 in the dielectric layer using photolithography. The openings can be filled with conductor materials including, but not limited to, W, Co, Cu, Al, silicides, or any combination thereof, using ALD, CVD, PVD, electroplating, any other suitable processes, or any combination thereof.

Figure 7I:
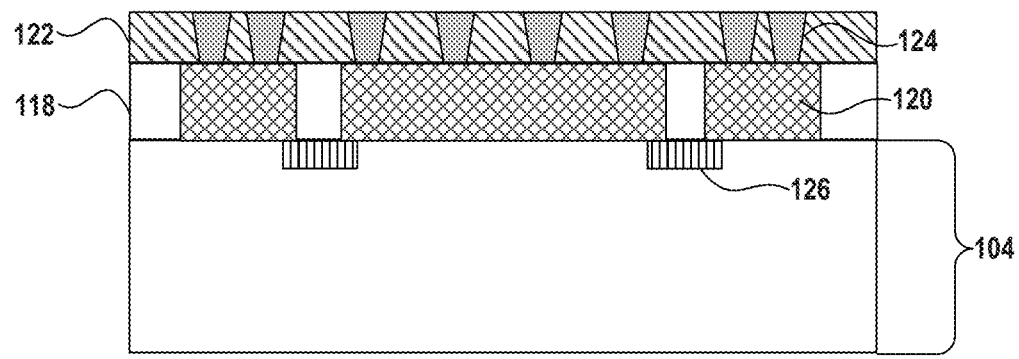

Method 500 proceeds to operation 518, as illustrated in FIG. 5, in which a second dielectric layer is formed on the metal layer. As illustrated in FIG. 7I, second dielectric layer 122 is formed on metal layer 118. Second dielectric layer 122 can be formed by one or more thin film deposition processes, such as ALD, CVD, PVD, or any combination thereof. Second dielectric layer 122 can include dielectric materials including, but not limited to, silicon oxide, silicon nitride, low-k dielectrics, or any combination thereof.

Method 500 proceeds to operation 520, as illustrated in FIG. 5, in which a plurality of second contacts are formed in the second dielectric layer. As illustrated in FIG. 7I, second contacts 124 are formed in second dielectric layer 122. At least some second contacts 124 can be in contact with metal patterns 120 to form electrical connections with metal patterns 120 and test circuits 126. In some embodiments, fabrication processes to form second contacts 124 include forming vertical openings through second dielectric layer 122 by dry/wet etch process, followed by filling the openings with conductor materials. Second contacts 124 can include conductor materials including, but not limited to, W, Co, Cu, Al, silicides, or any combination thereof. The openings of second contacts 124 can be filled using ALD, CVD, PVD, electroplating, any other suitable processes, or any combination thereof.

Figure 7J:
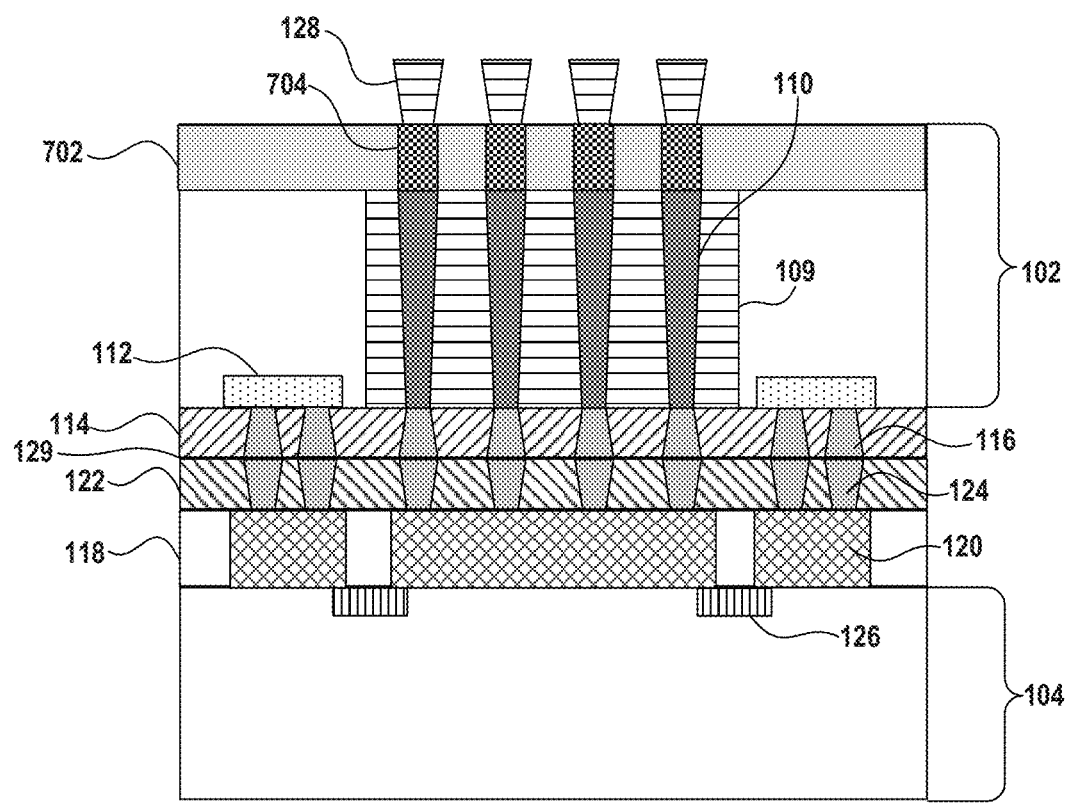

Method 500 proceeds to operation 522, as illustrated in FIG. 5, in which the first dielectric layer and the second dielectric layer are joined face to face, such that the memory array structure is above the peripheral device structure. Joining of the first and second dielectric layers can be performed by hybrid bonding. The first contacts can be in contact with the second contacts at the bonding interface. As illustrated in FIG. 7J, memory array structure 102 can be flipped, such that first dielectric layer 114 and second dielectric layer 122 are positioned face to face. After hybrid bonding, memory array structure 102 is above peripheral device structure 104. As a result, first contacts 116 and second contacts 124 can be in contact with one another at bonding interface 129. At least some of conductive pads 128, TSVs 704, TACs 110, memory array contacts 112, first contacts 116, second contacts 124, metal patterns 120, and test circuits 126 can form electrical connections for testing the test structures of the 3D memory device.

Figure 6:
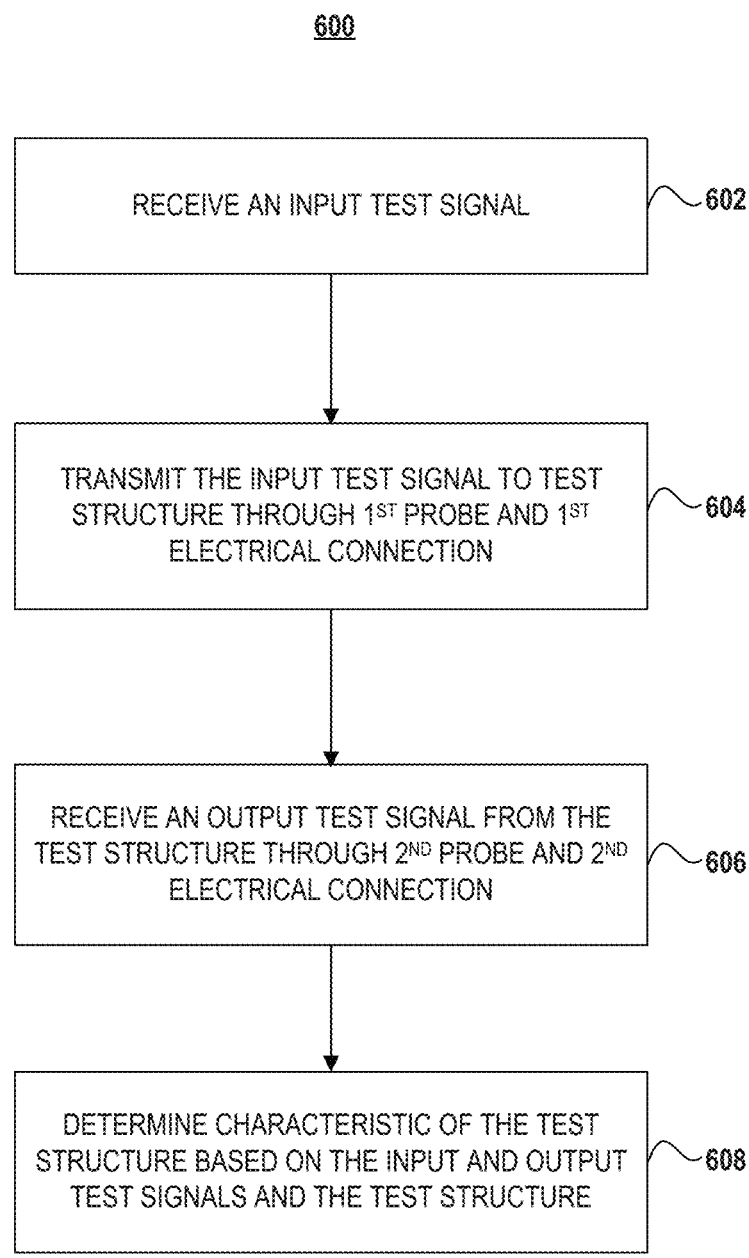
FIG. 6 is a flowchart of an exemplary method for testing a 3D memory device, according to some embodiments of the present disclosure.

FIG. 6 is a flowchart of an exemplary method 600 for testing a 3D memory device, according to some embodiments of the present disclosure. An example of the 3D memory device described in FIG. 6 is 3D memory devices 100 and 200 depicted in FIGS. 1 and 2. It should be understood that the operations shown in method 600 are not exhaustive and that other operations can be performed as well before, after, or between any of the illustrated operations.

Referring to FIG. 6, method 600 starts at operation 602, in which an input test signal for testing a test structure in a 3D memory device is received. In some embodiments, the test structure includes any structure in the memory array structure that is electrically connected to at least one of the memory array contacts (e.g., word line contacts, bit line contacts, or select gate contacts). For example, the test structure can include one or more NAND strings, one or more memory fingers, one or more memory blocks, one or more memory planes, one or more bit lines, one or more word lines, and one or more gate select lines. In some embodiments, the test structure includes any interconnect structure in the interconnect layer in which the bond interface is formed. The test structure can include one or more contact signal paths, each including a first contact for the memory array structure and a second contact for the peripheral device structure. In some embodiments, the test structure includes any peripheral device in the peripheral device structure that is electrically connected to or part of the test circuits in the peripheral device structure.

The input test signal can be generated by the electronic test system connected to the probe card based on the test structure and/or the characteristics to be tested. The input test signal can be a DC voltage signal, an AC voltage signal, or a current signal. The input test signal can be applied to a first conductive pad of the 3D memory device by a corresponding probe contacting the first conductive pad. The first conductive pad can be determined based on the test structure. At least part of the first conductive pad can be on the top surface of the 3D memory device.

Method 600 proceeds to operation 604, as illustrated in FIG. 6, in which the input test signal is transmitted through the first conductive pad and a first electrical connection to the test structure. The first electrical connection can include a first TAC (and a first TSV in some embodiments), and a first interconnect structure (e.g., including one or more first contacts for the memory array structure, one or more second contacts for the peripheral device structure, and one or more metal patterns). In some embodiments, the first electrical connection can also include a memory array contact (e.g., a bit line contact or a word line contact) and/or a test circuit.

Method 600 proceeds to operation 606, as illustrated in FIG. 6, in which an output test signal from the test structure is received by another probe of the probe card through a second conductive pad and a second electrical connection. The second electrical connection can include a second TAC (and a second TSV in some embodiments), and a second interconnect structure (e.g., including one or more first contacts for the memory array structure, one or more second contacts for the peripheral device structure, and one or more metal patterns). In some embodiments, the second electrical connection can also include a memory array contact (e.g., a bit line contact or a word line contact) and/or a test circuit.

The output test signal can be a DC voltage signal, an AC voltage signal, or a current signal. The output test signal can be transmitted to the second conductive pad of the 3D memory device and acquired by a corresponding probe contacting the second conductive pad. The second conductive pad can be determined based on the test structure. At least part of the second conductive pad can be on the top surface of the 3D memory device.

Method 600 proceeds to operation 608, as illustrated in FIG. 6, in which a characteristic of the test structure is determined based on the input test signal, the output test signal, and the test structure. The characteristic can include resistance or capacitance of the test structure and its value can be calculated by the electronic test system.

In some embodiments, a variety of characteristics of the same test structure and/or the same characteristics of a variety of test structures can be tested at the same time to increase test efficiency. Once the 3D memory device is docked into the probe card, multiple probes can contact multiple conductive pads of the 3D memory device to perform parallel testing at the same time.

Moreover, as the memory array structure can include repetitive structures (e.g., an array of NAND strings each having multiple memory cells, multiple memory fingers, blocks, and planes, or multiple bit lines and word lines). By designing the metal pattern layout in the metal layer, one or more sample structures of the repetitive structures can be tested by the probe card in parallel. For example, the probe card can be used to test different memory blocks, different bit lines and/or word lines in the same memory block, and bit lines corresponding to word lines in different positions.

Various embodiments in accordance with the present disclosure provide a 3D memory device with a structure for testing the 3D memory device. The 3D memory device disclosed herein can include an interconnect layer with interconnect structures between the front sides of the stacked peripheral device structure (e.g., a CMOS chip) and memory array structure (e.g., a memory array chip) and contacting the TACs of the memory array structure. The 3D memory device disclosed herein can further include conductive pads at the backside of the memory array structure for probe cards, so that various characteristics of different structures of the 3D memory device, as well as the quality of the hybrid bonding process forming the 3D memory device, can be tested using probe cards with real device density. As a result, the 3D memory device disclosed herein can enable the testability and uniformity of the characterization of the 3D memory device formed by hybrid bonding of the peripheral device structure and memory array structure, thereby reducing the overall process development time and increasing the manufacturing yield.

In some embodiments, a memory device includes a memory array structure, a first dielectric layer at a front side of the memory array structure, a plurality of first contacts in the first dielectric layer, a plurality of conductive pads at a backside of the memory array structure, a CMOS structure, a metal layer including a plurality of metal patterns at a front side of the CMOS structure, a second dielectric layer on the metal layer, and a plurality of second contacts in the second dielectric layer. The memory array structure includes a memory array stack, a TAC extending vertically through at least part of the memory array stack, and one or more memory array contacts. The first dielectric layer and the second dielectric layer are joined face to face, such that the memory array structure is above the CMOS structure, and one or more electrical connections are formed by at least the plurality of conductive pads, the TAC, the plurality of first contacts, the plurality of second contacts, the plurality of metal patterns in the metal layer, and at least one of the one or more memory array contacts.

In some embodiments, a 3D memory device includes a memory array structure, a peripheral device structure, and an interconnect layer in contact with a front side of the memory array structure and a front side of the peripheral device structure, and a conductive pad at a back side of the memory array structure and that overlaps the memory array structure. The memory array structure includes a memory array stack, a TAC extending vertically through at least part of the memory array stack, and a memory array contact. The peripheral device structure includes a test circuit. The interconnect layer includes an interconnect structure. The conductive pad, the TAC, the interconnect structure, and at least one of the test circuit and the memory array contact are electrically connected.

In some embodiments, a method for forming a memory device is disclosed. A memory array structure including a memory array stack and one or more memory array contacts is formed. A TAC extending vertically through at least part of the memory array stack of the memory array structure is formed. A first dielectric layer is formed at a front side of the memory array structure. A plurality of first contacts are formed in the first dielectric layer. A plurality of conductive pads are formed at a backside of the memory array structure. A CMOS structure is formed. A metal layer including a plurality of metal patterns is formed at a front side of the CMOS structure. A second dielectric layer is formed on the metal layer. A plurality of second contacts are formed in the second dielectric layer. The first dielectric layer and the second dielectric layer are joined face to face, such that the memory array structure is above the CMOS structure, and one or more electrical connections are formed by at least the plurality of conductive pads, the TAC, the plurality of first contacts, the plurality of second contacts, the plurality of metal patterns in the metal layer, and at least one of the one or more memory array contacts.

In some embodiments, a method for testing a memory device is disclosed. The memory device includes a memory array structure, a first dielectric layer at a front side of the memory array structure, a plurality of first contacts in the first dielectric layer, a plurality of conductive pads at a backside of the memory array structure, a CMOS structure, a metal layer including a plurality of metal patterns at a front side of the CMOS structure, a second dielectric layer on the metal layer, and a plurality of second contacts in the second dielectric layer. The memory array structure includes a memory array stack, a TAC extending vertically through at least part of the memory array stack, and one or more memory array contacts. An input signal for testing a test structure in the memory device is received. The input signal is transmitted to the test structure through a first probe and a first electrical connection including one of the plurality of conductive pads, one of the plurality of TACs, one of the plurality of first contacts, one of the plurality of second contacts, one of the plurality of metal patterns in the metal layer, and at least one of the one or more memory array contacts. An output signal is received from the test structure through a second probe and a second electrical connection including one of the plurality of conductive pads, one of the plurality of TACs, one of the plurality of first contacts, one of the plurality of second contacts, one of the plurality of metal patterns in the metal layer, and at least one of the one or more memory array contacts. A characteristic of the test structure in the memory device is determined based on the input signal, the output signal, and the test structure.

In some embodiments, a method for testing a 3D memory device is disclosed. An input signal is applied to a first conductive pad of the memory device by a first probe of a probe card. At least part of the first conductive pad is on a top surface of the memory device. Through at least the first conductive pad, a first TAC of the memory device, a first interconnect structure passing through a bonding interface of the memory device, and at least one of a memory array contact and a test circuit of the memory device, the input signal is transmitted to a test structure of the memory device. Through at least a second interconnect structure passing through the bonding interface, a second TAC of the memory device, and the at least one of the memory array contact and the test circuit, an output signal is received from the test structure. The output signal is received from a second conductive pad of the memory device by a second probe of the probe card. At least part of the second conductive pad is on the top surface of the memory device. A characteristic of the test structure is determined based on the input signal and the output signal.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
   a memory array structure comprising:
      a memory array stack;
      a through array contact (TAC) extending vertically through at least part of the memory array stack; and
      one or more memory array contacts;
   a first dielectric layer at a front side of the memory array structure;
   a plurality of first contacts in the first dielectric layer;
   a plurality of conductive pads at a backside of the memory array structure;
   a complementary metal-oxide-semiconductor (CMOS) structure;
   a metal layer at a front side of the CMOS structure, the metal layer comprising a plurality of metal patterns;
   a second dielectric layer on the metal layer; and a plurality of second contacts in the second dielectric layer,
wherein the metal layer is between the second dielectric layer and the CMOS structure,
wherein the first dielectric layer and the second dielectric layer are joined face to face, such that the memory array structure is above the CMOS structure, and one or more electrical connections are formed by at least the plurality of conductive pads, the TAC, the plurality of first contacts, the plurality of second contacts, the plurality of metal patterns in the metal layer, and at least one of the one or more memory array contacts.

2. The memory device of claim 1, wherein at least one of the plurality of first contacts and at least one of the plurality of second contacts form a contact signal path.

3. The memory device of claim 2, wherein the one or more memory array contacts comprise at least one of a word line contact and a bit line contact.

4. The memory device of claim 3, wherein the plurality of conductive pads, the TAC, the plurality of first contacts, the plurality of second contacts, the plurality of metal patterns in the metal layer, and the word line contact are electrically connected to form a first one of the one or more electrical connections to test a plurality of contact signal paths.

5. The memory device of claim 3, wherein the plurality of conductive pads, the TAC, the plurality of first contacts, the plurality of second contacts, the plurality of metal patterns in the metal layer, and the bit line contact are electrically connected to form a second one of the one or more electrical connections to test a plurality of contact signal paths.

6. The memory device of claim 4, wherein the plurality of contact signal paths are connected in series.

7. The memory device of claim 4, wherein at least some of the plurality of contact signal paths are connected in parallel.

8. The memory device of claim 7, wherein at least one half of the plurality of contact signal paths are connected in parallel.

9. The memory device of claim 1, wherein the CMOS structure comprises a test circuit electrically connected to the metal layer.

10. The memory device of claim 9, wherein the test circuit comprises at least one of a memory array structure test circuit and a contact signal path test circuit.

11. The memory device of claim 10, wherein the memory array structure test circuit comprises at least one of a memory plane test circuit, a memory block test circuit, a bit line test circuit, and a word line test circuit.

12. The memory device of claim 1, wherein the memory array structure further comprises a third contact, wherein at least one of the plurality of conductive pads is electrically connected to the TAC by the third contact.

13. A method for forming a memory device, comprising:
forming a memory array structure comprising a memory array stack and one or more memory array contacts;
forming a through array contact (TAC) extending vertically through at least part of the memory array stack of the memory array structure;
forming a first dielectric layer at a front side of the memory array structure;
forming a plurality of first contacts in the first dielectric layer;
forming a plurality of conductive pads at a backside of the memory array structure;
forming a complementary metal-oxide-semiconductor (CMOS) structure;
forming a metal layer at a front side of the CMOS structure, the metal layer comprising a plurality of metal patterns;
forming a second dielectric layer on the metal layer, wherein the metal layer is between the second dielectric layer and the CMOS structure;
forming a plurality of second contacts in the second dielectric layer; and
joining the first dielectric layer and the second dielectric layer face to face, such that the memory array structure is above the CMOS structure, and one or more electrical connections are formed by at least the plurality of conductive pads, the TAC, the plurality of first contacts, the plurality of second contacts, the plurality of metal patterns in the metal layer, and at least one of the one or more memory array contacts.

14. The method of claim 13, further comprising, prior to forming a metal layer at a front side of the CMOS structure, forming a test circuit, wherein the metal layer is electrically connected to the test circuit.

15. The method of claim 13, further comprising, prior to forming a plurality of conductive pads at a backside of the memory array structure, forming a third contact from the backside of the memory array structure, wherein:
at least one of the plurality of conductive pads is electrically connected to the TAC by the third contact; and
the at least one of the plurality of conductive pads is formed above the third contact.

* * * * *